US007664156B2

United States Patent
Yamazaki

(10) Patent No.: US 7,664,156 B2
(45) Date of Patent: Feb. 16, 2010

(54) WAVELENGTH TUNABLE LASER

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/364,053

(22) Filed: Mar. 1, 2006

(65) Prior Publication Data

US 2006/0198416 A1    Sep. 7, 2006

(30) Foreign Application Priority Data

Mar. 3, 2005    (JP)    ............................. 2005-059639

(51) Int. Cl.
H01S 3/083    (2006.01)
(52) U.S. Cl. .......................................... 372/94; 372/34
(58) Field of Classification Search .................... 372/94
See application file for complete search history.

(56) References Cited

U.S. PATENT DOCUMENTS

| | | | | |
|---|---|---|---|---|
| 6,636,668 B1 * | 10/2003 | Al-hemyari et al. | ............ | 385/40 |
| 6,853,773 B2 * | 2/2005 | Lin | ............................. | 385/39 |
| 7,065,276 B2 * | 6/2006 | Scheuer et al. | ................ | 385/50 |
| 2002/0018507 A1 * | 2/2002 | Deacon | ........................ | 372/96 |
| 2002/0076149 A1 * | 6/2002 | Deacon | ........................ | 385/27 |
| 2003/0219045 A1 * | 11/2003 | Orenstein et al. | ............. | 372/20 |
| 2004/0258360 A1 * | 12/2004 | Lim et al. | ..................... | 385/43 |

FOREIGN PATENT DOCUMENTS

| | | |
|---|---|---|
| JP | 58-111501 A | 7/1983 |
| JP | 62-100706 A | 5/1987 |
| JP | 6-188497 A | 7/1994 |
| JP | 2004-37524 A | 2/2004 |
| WO | WO2004/034528 A2 * | 4/2004 |
| WO | WO 2005/096462 A1 | 10/2005 |

OTHER PUBLICATIONS

Yamazaki H. et. al. "Widely Tunable Laser Consisting of a Silica Waveguid Double Ring Resonator Connected Directly to a Semiconductor Optical Amplifier" Proceedings of the European Conference on Optical Communications (ECOC) 2004, Post Deadline Paper TH4.2.4, 2004, pp. 22-23, XP009066926.*

(Continued)

Primary Examiner—Minsun Harvey
Assistant Examiner—Joshua King
(74) Attorney, Agent, or Firm—Sughrue Mion, PLLC

(57) ABSTRACT

A wavelength tunable laser comprises a multiple ring resonator, an input/output side waveguide coupled to a ring resonator, a reflection side waveguide coupled to a ring resonator, a multiple ring resonator, a PLC substrate where the input/output side waveguide and the reflection side waveguide are formed, a high reflection film set on the reflection side waveguide, a SOA connected to the input/output side waveguide through a anti-reflection film, a film heater which is placed above a ring waveguide for wavelength tuning in the PLC substrate and provides heat to the ring waveguide for wavelength tuning, and a adiabatic groove, which restrain conducting heat provided by the film heater to the PLC substrate except the ring waveguide for wavelength tuning.

9 Claims, 3 Drawing Sheets

OTHER PUBLICATIONS

Takahashi M et. al. "A Stable Widely Tunable Laser Using a Silica-Waveguide Triple-Ring Resonator" 2005 Optical Fiber Communications Conference Post Deadline Paper (IEEE CAT. No. 05CH37672) IEEE Piscata Way, NJ, USA, vol. 5, 2005, p. 3, XP002382864, ISBN: 1-55752-783.*

Rabus et al., "Box-Like Filter Response of Triple Ring Resonators with Integrated SOA Sections Based on GaInAsP/InP", 2002, IEEE IPRM'02, 479-482.*

Yamazaki H. et al: "Widely Tunable Laser Consisting of a Silica Waveguide Double Ring Resonator Connected Directly to a Semiconductor Optical Amplifier" Proceedings of the European Conference on Optical Communications (ECOC) 2004, Postdeadline Paper TH4.2.4, 2004, pp. 22-23, XP009066926* the whole document *.

Yamagata S et al: "Wide-range tunable microring resonator filter by thermo-optic effect in polymer waveguide" Japanese Journal of Applied Physics, Part 1 (Regular Papers, Short Notes & Review Papers) Japan Soc. Appl. Phys Japan, vol. 43, No. 8B, Aug. 2004, pp. 5766-5770, XP002383403 ISSN: 0021-4922 * p. 5768, right-hand column; figure 1 *.

Okuno M et al: "Silica-Based Thermo-Optic Switches" NTT Review, Telecommunications Association, Tokyo, JP, vol. 7, No. 5, Sep. 1, 1995, pp. 57-63. XP000536281 ISSN: 0915-2334 *p. 61, left-hand column, paragraph; 3-right-hand column, paragraph 1; figure 8.

Yamazaki H: et al: "Widely Tunable Laser Consisting of a Silica Waveguide Double Ring Resonator Connected Directly to a Semiconductor Optical Amplifier" Proceedings of the European Conference on Optical Communications (ECOC) 2004, Postdeadline Paper TH4.2.4, 2004, pp. 22-23, XP009066926* the whole document *.

Okuno M et al: "Silica-Based Thermo-Optic Switches" NTT Review, Telecommunications Association, Tokyo, JP, vol. 7. No. 5, Sep. 1, 1995, pp. 57-63. XP000536281 ISSN: 0915-2334 *p. 61, left-hand column, paragraph; 3-right-hand column, paragraph 1; figure 8.

Okuno M Ed-Sawchuck A A (ED) Optical Society of America / Institute of Electrical and Electronics Engineers: "Highly integrated PLC-type optical switches for OADM and OXC systems" Optical Fiber Communication Conference. (OFC). Postconference Digest. Atlanta, GA, Mar. 23-28, 2003, Trends in Optics and Photonics Series. (TOPS), Washington, DC: OSA, ,US, vol. TOPS. vol. 86, Mar. 23, 2003, pp. 169-170, XP010680231 *section 2.2 *, *figure 1b *.

Ishizaka Masahige et al: "Wavelength tunable laser using silica double ring resonators" Electron Commun JPN Part II Electron; Electronics and Communications in Japan, Part II: Electronics (English Translation of Denshi Tsushin Gakkai Ronbunshi) Mar. 2006, vol. 89, No. 3, Mar. 2006, pp. 34-41, XP002383404.

Takahashi M. et al: "Variable Optical Attenuators Array with Low Power Consumption" 2003 Proceedings IEICE General Conference, C3-106, 2003, p. 246, XP009066917 *figure 1 *.

Takahashi M et al: "A stable widely tunable laser using a silica-waveguide triple-ring resonator" 2005 Optical Fiber Communications Conference Post Deadline Papers (IEEE CAT. No. 05CH37672) IEEE Piscataway, NJ, USA, vol. 5, 2005, p. 3 pp. vol. 5, XP002382864, ISBN: 1-55752-783-0, * the whole document *.

Kohroh Kobayashi, "Optical Integrated Devices," the second impression of the first edition, published by Kyoritsu Shuppan Co., Ltd., Dec. 2000, pp. 104-122.

* cited by examiner

WAVELENGTH TUNABLE LASER

BACKGROUND OF THE INVENTION

1. Field of the Invention

The present invention relates to such as a wavelength tunable laser with a wavelength monitor (hereinafter called merely "a wavelength tunable laser") in which the wavelength monitor detects wavelength. The wavelength tunable laser is used for, for example, a WDM (Wavelength Division Multiplexing) transmission system.

2. Description of the Related Art

Embarking on a broadband era, the WDM transmission system which enables communication through a plurality of light wavelengths per system is introduced increasingly in order for an effective use of an optical fiber. Recently, a DWDM device (a Dense Wavelength Division Multiplexing) is also used extensively which multiplexes several dozen of light wavelengths and enables to transmit in higher-speed. Accordingly, a light source corresponding to every light wavelength is required by each WDM transmission system, and a numbers of light sources are required increasingly along with the high-multiplexing. A ROADM (Reconfigurable optical add/drop multiplexers) which adds/drops an optional wavelength at each node is also examined recently for commercial use. If the ROADM system is introduced, a transmission capacity can expand by multiplexing a wavelength and optical paths can be switched by tuning a wavelength, which leads to an optical network with high flexibility.

A DFB-LD (Distributed feedback laser diode) oscillates at a SLM (Single longitudinal mode) is conventionally used widely as a light source for the WDM transmission system because it is easy to use and has high reliability. The DFB-LD has a diffraction grating in about 30 nm depth formed in the whole area thereof, so that a SLM oscillation is stably obtained at a wavelength corresponding to a product of a grating cycle by twice times of an equivalent refractive index. However, because the DFB-LD is unable to tune oscillating wavelengths in a wide range, a WDM transmission system needs manufactures with different wavelengths at every ITU (international telecommunication unit) grids. Therefore, the cost of a shelf control and excess stocks to repair has been increased because different manufactures are required by each wavelength. Moreover, if a normal DFB-LD is used in the ROADM which switches optical paths according to a wavelength, a tunable range of wavelength window is limited in about 3 nm which can be varied by temperature change. Thus, it is difficult to configure an optical network fully leveraging the feature of ROADM which actively utilizes wavelength resources.

In order to overcome the problem with the present DFB-LD and to achieve a SLM oscillation in a wide wavelength range, the intense study is now under way for a wavelength tunable laser. In the followings, a conventional wavelength tunable laser is explained showing some examples from a non-patent literature 1.

The wavelength tunable lasers are classified in two types, one has a wavelength tunable mechanism inside of its laser device and the other has a wavelength tunable mechanism outside of its laser device.

As the former type, a DBR-LD (Distributed Bragg Reflector Laser Diode) is proposed where an active region to generate a gain and a DBR region to reflect light with a diffraction grating are formed in the same laser device. A wavelength tunable range of this DBR-LD is about 10 nm at the widest. A DBR-LD using an uneven pattern of diffraction grating is also proposed as the former type where an active region to generate a gain and a DBR regions placed in front and in backside of the active region are formed in the same laser device. A number of reflection peaks are generated in the DBR regions in front and in backside of the active region by the uneven pattern of diffraction grating, and intervals of reflection peaks in the front DBR region is slightly different from intervals of reflection peaks in the backside DBR regions. "Vernier effect" can be obtained by this structure, which enables to tune a wavelength over a very wide range. The DBR-LD using the uneven pattern of diffraction grating can operate to tune over a wavelength range of 100 nm and more and to tune quasi-continuously a wavelength range of 40 nm.

On the other hand, a wavelength tunable laser proposed as the latter type which returns a specific wavelength into a laser device by turning over a diffraction grating. This type of wavelength tunable laser requires monitoring an oscillating wavelength gradually. Conventionally, a wavelength selective component such as Etalon is installed in the module to monitor an oscillating wavelength.

[Non-Patent Literature 1] "Optical Integrated Devices" by Kohroh Kobayashi, pp 104-122, the second impression of the first edition, published by Kyoritsu Shuppan Co., Ltd., December 2000

Many types of configurations are proposed as the conventional wavelength tunable lasers, however, they have disadvantages such as a mode hopping occurrence, a complicated method for wavelength control, low vibration resistance and high price due to an enlarged device. Therefore, it has been difficult for those lasers to be put into practical use.

As for the DBR-LD, a wavelength can be tuned by injecting carriers into the DBR region so as to vary a refraction index of the wavelength at the DBR region. However, current injection causes a formation of a crystal defect, which changes a rate of refractive index fluctuation to current injection extremely. Accordingly, it is difficult to keep laser oscillation at a certain wavelength over a long term. Moreover, because a compound semiconductor cannot be processed in and bigger than 2-inch size with the current technology, a laser device becomes enlarged and complex, so the current cost is difficult to be reduced.

On the other hand, as for the configuration where a wavelength tunable mechanism is set outside of a laser device, mode jumping occurs easily due to oscillation, so a grand mechanism with vibration resistance is required to avoid it. Accordingly, the module size becomes enlarged and the price increases.

SUMMARY OF THE INVENTION

It is therefore an object of the present invention to overcome the problems with the conventional wavelength tunable lasers for practical use and to provide a wavelength tunable laser which achieves high reliability, high performance, low cost, low power consumption and stable operation.

A wavelength tunable laser relating to the present invention comprises a multiple ring resonator wherein a plurality of ring resonators are combined each other by an optical coupling unit, and ring waveguides for wavelength tuning and wavelength fixing included by the ring resonators have different optical path lengths from each other. The wavelength tunable laser further comprises an input/output side waveguide whose end is coupled to one of the plurality of ring resonators by an optical coupling unit, a reflection side waveguide whose end is coupled to another ring resonator of the plurality of the ring resonators by an optical coupling unit, a substrate on which the multiple ring resonator, the input/ output side waveguide and the reflection side waveguide are formed, a light reflection unit set at a remaining end of the reflection side waveguide, a light input/output unit connected at the light input/output terminal to a remaining end of the input/output side waveguide, a heat supply unit placed on the surface of the substrate which is just above the ring waveguide for wavelength tuning for supplying the heat to the ring waveguide for wavelength tuning, and a thermal conduction restrain unit which restrains heat provided by the heat supply unit from conducting to the substrate, except to the ring waveguide for wavelength tuning.

Light outputted from the light input/output unit goes through the light input/output terminal, the input/output side waveguide, the optical coupling unit, the multiple ring resonator, the optical coupling unit, the reflection side waveguide, the light reflection unit, the reflection side waveguide, the optical coupling unit, the multiple ring resonator, the optical coupling unit, the input/output side waveguide and returns to the light input/output terminal. This return light is the strongest at a resonant wavelength of the multiple ring resonator. The reason is that each ring resonator which comprises the multiple ring resonator has a slightly different FSR (Free spectral range) and that greater reflection occurs at a wavelength where periodical variations of reflection (transmission) at each ring resonator are matched (resonant wavelength).

Also, a wavelength where respective cycles are matched varies greatly according to variation of a circumference length and a refraction index of waveguide of each ring resonator, so tunable operation for a wavelength can be efficient. This refraction index of waveguide can be changed by a thermo-optical effect. The thermo-optical effect is a phenomenon where refraction index of material is increased by heat, which can occur commonly in any materials. Accordingly, the resonant wavelength of the multiple ring resonator can be tuned by utilizing temperature characteristics of a plurality of ring resonators, in other words, the resonant wavelength of the multiple ring resonator can be tuned by providing heat from the heat supply unit to the ring waveguide for waveguide tuning. As described, in the present invention, the multiple ring resonator is configured by connecting serially a plurality of ring resonators which has slightly different circumferences respectively, and vernier effect occurs thereby is skillfully utilized.

In this case, the thermal conduction restrain unit restrains conducting heat provided by the heat supply unit to the substrate except the ring waveguide for wavelength tuning. Consequently, heat provided by the heat supply unit is conducted to the ring waveguide for waveguide tuning without any loss, and low power consumption and fast response can be achieved.

The substrate is such as a PLC substrate. The light input/output unit is such as a semiconductor optical amplifier (hereinafter called "SOA"), an optical fiber amplifier, a semiconductor laser. The heat supply unit is such as a heat application unit providing positive heat, a cooling unit providing negative heat and heat application/cooling unit providing both positive and negative heat (for example, Peltier device). More specifically, it may be a film heater set on a substrate. The film heater is easily manufactured by forming such as a metallic film on a substrate. Additionally, a temperature adjustment unit may be comprised further to keep certain temperature on a substrate in order to have a FSR of a ring resonator for waveguide fixing matched with an ITU grid.

The thermal conduction restrain unit may be an adiabatic groove formed in a substrate around a ring waveguide for wavelength tuning. This adiabatic groove may be formed from the surface of a substrate through the underneath of a ring waveguide for wavelength tuning to a surface of the substrate again. In this case, thermal conduction is restrained from underneath of a ring waveguide for wavelength tuning to a substrate, which increases adiabatic effect more. Note that, the adiabatic groove may be a cavity, or alternatively, a material filled in a substrate which has higher thermal resistance than the substrate.

According to the present invention, a wavelength tunable laser where a multiple ring resonator and a light input/output unit are combined offers the following advantages. A ring resonator for wavelength fixing does not have an adiabatic structure therein so as to keep a low thermal resistance condition, and achieves stable operation thereof in variation of ambient temperature. On the other hand, a ring resonator for wavelength tuning with a heat supply unit attached thereto has an adiabatic groove nearby so that thermal resistance thereof increases and power consumption is reduced. As described, thermal resistances are arranged at each ring resonator formed in a substrate in accordance with purposes of the ring resonators so that low power consumption and stable operation can be achieved.

BRIEF DESCRIPTION OF THE DRAWINGS

FIG. 2 is a cross-sectional view of the wavelength tunable laser in FIG. 1 along with the line II-II.

DETAILED DESCRIPTION OF THE PREFERRED EMBODIMENTS

In the followings, embodiments of the present invention will be described in detail by referring to the attached drawings.

First Embodiment

Figure 1:
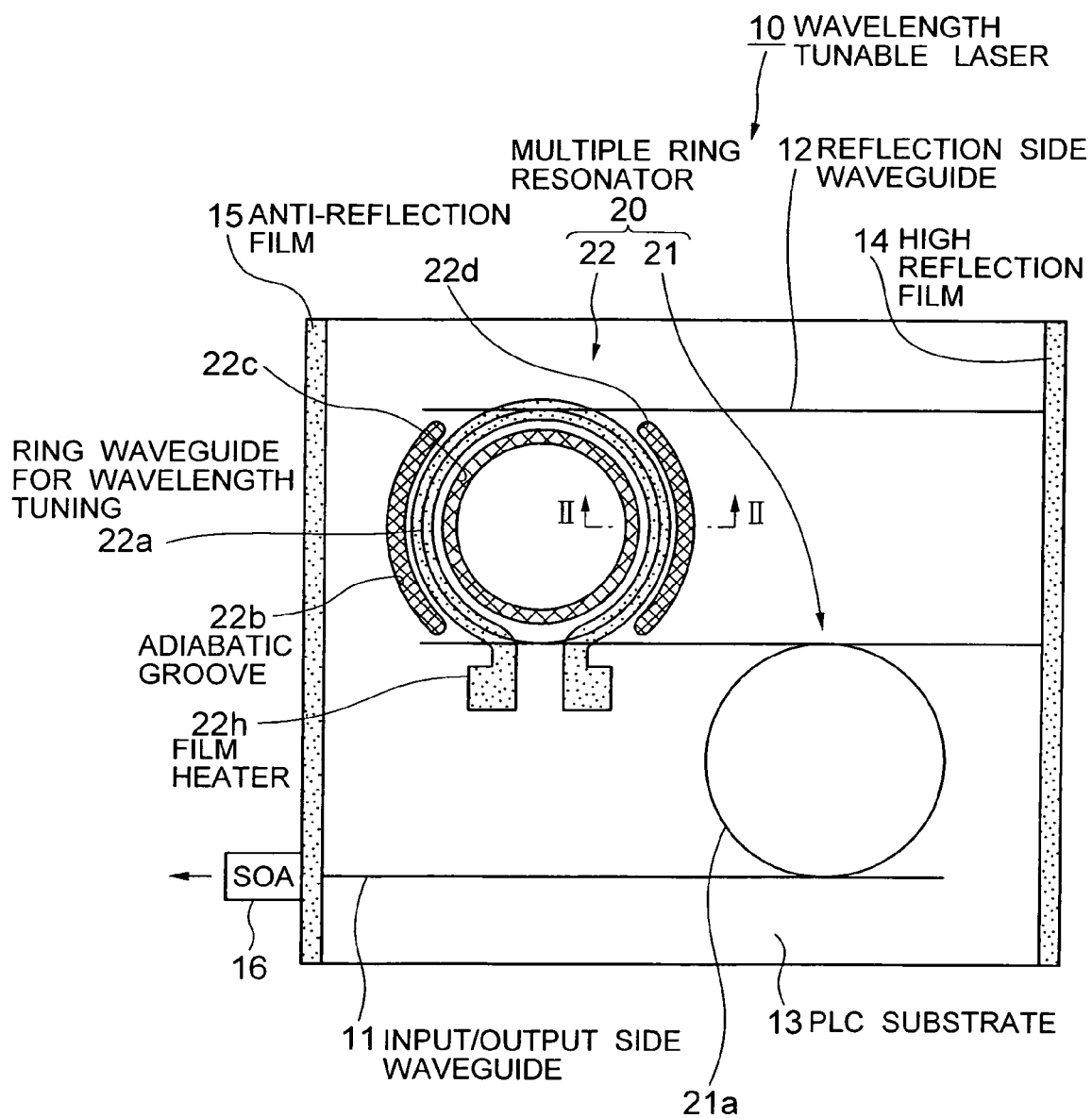
FIG. 1 is a plan view showing a wavelength tunable laser relating to a first embodiment of the present invention.

As shown in FIG. 1, a wavelength tunable laser 10 of the present embodiment comprises a multiple ring resonator 20, an input/output side waveguide 11, a reflection side waveguide 12, a high reflection film 14, a light input/output unit 16, a film heater 22h and adiabatic grooves 22b, 22c and 22d.

The multiple ring resonator 20 comprises two ring resonators 21 and 22 combined. A ring resonator 21 has a ring waveguide 21a, and the other ring resonator, a resonator 22 has a ring waveguide 22a. The ring waveguides 21a and 22a are coupled by a directional coupler and a waveguide (hereinafter both numerals are omitted). Here, the two ring resonators 21 and 22 are serially-connected in the multiple ring resonator 20 relating to the embodiments for the present invention.

The input/output side waveguide 11 is coupled to the ring waveguide 21a of the ring resonator 21 through a directional coupler. Also, the reflection side waveguide 12 is coupled to the ring waveguide 22a of the ring resonator 22 through a directional coupler. The high reflection film 14 is set at the end of the reflection side waveguide and has a function to reflect light signal, which is outputted from the multiple ring resonator 20 to the reflection side waveguide 12, to the reflection side waveguide 12 side. The SOA 16 is connected at its input/output terminal to the input/output side waveguide 11 through an anti-reflection film 15.

The multiple ring resonator 20, the input/output side waveguide 11 and the reflection side waveguide 12 are formed in the PLC substrate 13.

The film heater 22h surrounding the ring waveguide 22a is formed on the PLC substrate 13 and provides heat to the ring waveguide 22a. The adiabatic grooves 22b and 22d covering the film heater 22h at the peripheral side are formed in the PLC substrate 13 and the adiabatic groove 22c covering the film heater 22h at the inner peripheral side are formed in the PLC substrate 13. Those adiabatic grooves 22b, 22c and 22d prevent heat provided by the film heater 22h from acting on other component parts in the PLC substrate 13. Especially, the adiabatic grooves 22b, 22c and 22d prevent heat provided by the film heater 22h from varying optical path length, that is a circumferential length, and a refraction index of the ring waveguide 21a in the ring resonator 21.

Optical path lengths of the ring waveguide 21a for fixing a wavelength and the ring waveguide 22a for tuning a wavelength are set in different length each other. The film heater 22h is made of such as aluminum film and created into a circular shape along with the ring waveguide 22a for wavelength tuning. Both sides of the circular shape are conducting electrodes. Because optical path lengths of the ring waveguides 21a and 22a are set in different, the multiple ring resonator 20 in which the ring resonators 21 and 22 are combined is to resonate at a wavelength where frequencies of the ring resonators 21 and 22 with different cycles from each other are crossed. Also, a resonant wavelength of the multiple ring resonator 20 can be tuned according to circumferential lengths and refractive index fluctuations of the ring waveguides 21a and 22a. So, in the present embodiment, the resonant wavelength of the multiple ring resonator 20 is tuned by the circumferential lengths and refraction indexes of the ring waveguide 21a and 22a varied by heat provided from the film heater 22h.

As the light input/output unit 16, a semiconductor optical amplifier, SOA, is used. Alternatively, an optical fiber amplifier may be used. Here the PLC substrate 13 may be set on a Peltiert device as a temperature control device. This Peltiert device keeps a certain temperature of the PLC substrate 13 in order that a FSR of the ring resonator 21 is match with an ITU grid.

According to the present embodiment of the present invention shown in FIG. 1, light outputted from the SOA 16 goes through the light input/output terminal, the light input/output side waveguide 11, the directional coupler, the multiple ring resonator 20, the directional coupler, the reflection side waveguide 12 and reaches the high reflection film 14, and is reflected by the high reflection film 14 and return through the reflection side waveguide 12, the directional coupler, the multiple ring resonator 20, the directional coupler, the input/output side waveguide 11 to the light input/output terminal.

The return light becomes the strongest at a wavelength where the multiple ring resonator 20 resonates. The reason is that each ring resonator 21 and 22 configuring the multiple ring resonator 20 has slightly different FSRs respectively and reflection occurs in larger scale at a wavelength where periodical changes of reflections (transmission) occurring at each ring resonator 21 and 22 are matched (a resonant wavelength).

Additionally, because the resonant wavelength of the multiple ring resonator 20 varies greatly according to variation of the circumferential lengths and the refraction indexes of the waveguides in each ring resonator 21 and 22, tuning operation for a wavelength can be efficient at the multiple ring resonator 20 based on heat supply from the film heater 22h. The refraction index of waveguide can be varied by thermooptic effect. That is, the film heater 22h provides heat to the ring waveguide 22a for wavelength tuning so that a plurality of the ring resonators 21 and 22 can utilize temperature characteristics, and a resonant wavelength of the multiple ring resonator 20 can be tuned. Thus, the multiple resonator 20 is configured with connecting serially the ring resonators 21 and 22 where both circumferences are slightly different from each other, which causes vernier effect that is utilized skillfully in the present embodiment.

At this point, adiabatic grooves 22b, 22c and 22d restrain conducting heat from the film heater 22h to the PLC substrate 13 except the ring waveguide for wavelength tuning 22a. Consequently, heat provided by the film heater 22h is conducted to the ring waveguide for wavelength tuning 22a without any loss of heat, and low power consumption and fast response can be achieved.

Figure 2A:
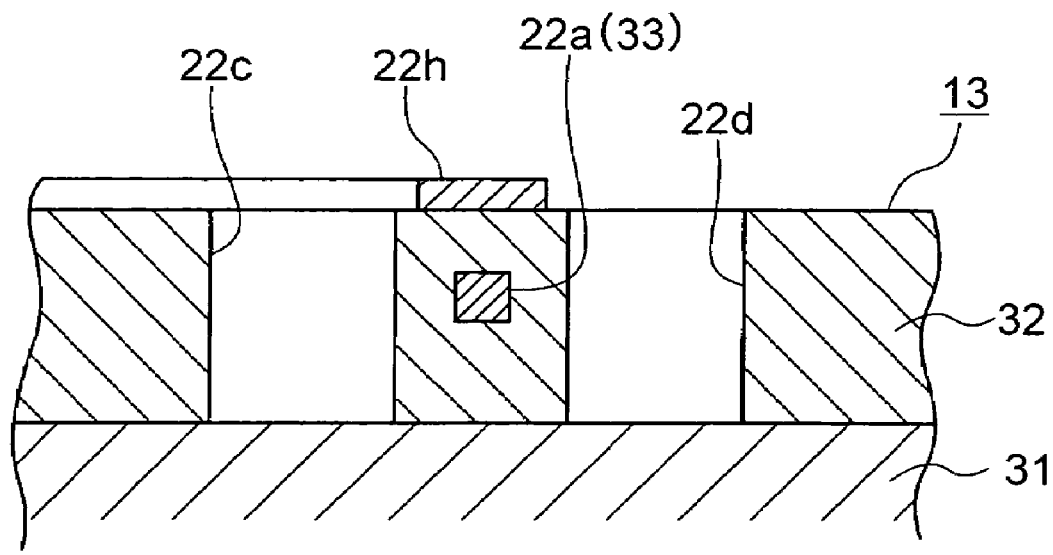
FIG. 2A shows a first example.
Figure 2B:
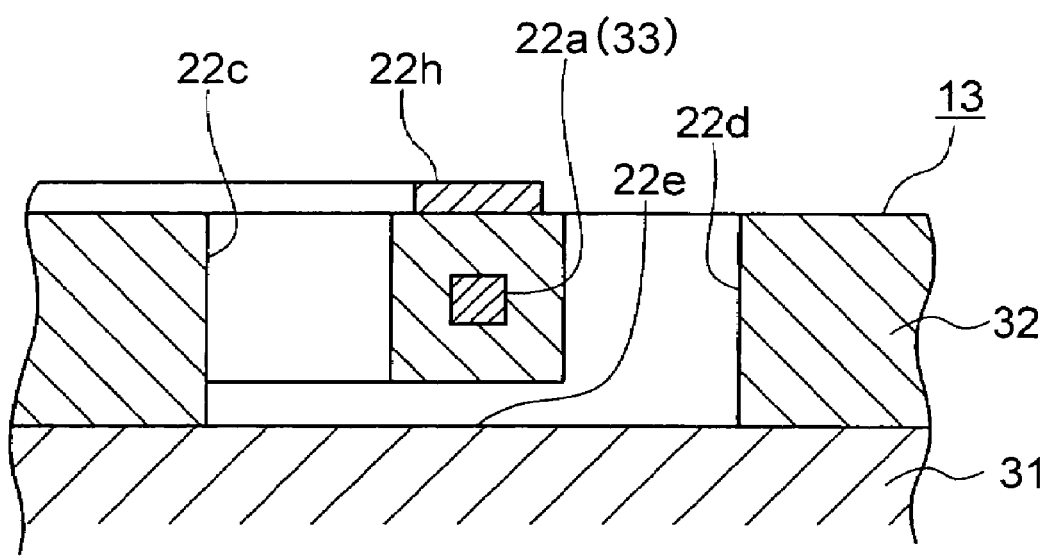
FIG. 2B shows a second example.

The adiabatic grooves 22b, 22c and 22d are illustrated in FIG. 2A and FIG. 2B. As shown in FIG. 2A, the adiabatic grooves 22b, 22c and 22d are preferably deeper than the ring waveguide for wavelength tuning 22a so as to reinforce adiabatic efficiency. The adiabatic grooves 22b and 22d is positioned outside of the ring waveguide for wavelength tuning 22a, and formed in circular arch shape along with the ring waveguide for wavelength tuning 22a. The adiabatic groove 22c is positioned inside of the ring waveguide for wavelength tuning 22a, and formed in circular shape along with the ring waveguide for wavelength tuning 22a.

The PLC substrate 13 is formed on a silicon substrate 31 with a cladding layer 32 including a core layer 33. The core layer 33 inside of the cladding layer 32 is corresponding to the ring waveguide 21a of the ring resonator 21. The ring waveguide 22a of the ring resonator 22 is structured as a core layer laid within a cladding layer, as well as the ring waveguide 21a. As for the ring waveguide 22a, the adiabatic grooves 22b, 22c and 22d prevent heat therefrom.

Next, a method for forming the adiabatic grooves 22b, 22c and 22d is explained. First, the cladding layer 32 having the core layer 33 is created on the silicon substrate 31 with a common method for PLC manufacturing. Then, the adiabatic grooves 22b, 22c and 22d are obtained by etching the cladding layer 32.

As for a structure of the adiabatic grooves shown in FIG. 2B, the adiabatic groove 22e is formed under the ring waveguide for waveguide tuning 22a. That is, the adiabatic grooves 22b, 22c, 22d and 22e are formed from the surface of the PLC substrate 13 through the underneath of the ring waveguide for waveguide tuning 22a and to the surface of the PLC substrate 13. In this case, because heat conduction is restrained from the underneath of the ring waveguide for wavelength tuning 22a to the PLC substrate 13, adiabatic effect is increased.

Next, a method for forming the adiabatic groove 22e is explained. First, a sacrifice layer which is made of other material is created on the silicon substrate 31, and a cladding layer 32 having a core layer 33 is formed thereon. Subsequently, the cladding layer 32 is etched to create the adiabatic grooves 22b, 22c and 22d. Finally, the adiabatic groove 22e is obtained by etching only the sacrifice layer.

The wavelength tunable laser 10 described in details above will be explained further.

In the wavelength tunable laser 10 relates to the embodiments of the present invention, periodical variation of reflecting (transmitting) an optical signal by the ring resonator 21 is conformed to a regular cycle of an ITU grid so that a wavelength is fixed by using the ring resonator 21. The periodical variation of reflecting (transmitting) an optical signal by the ring resonator 21 used for fixing a wavelength adjusts temperature over the whole PLC substrate 13. More specifically, the whole PLC substrate 13 is kept in a certain temperature so as to restrain variation of a circumferential length and a refraction index of the ring waveguide 21a and to fix an optical path length of the ring waveguide 21a, which conforms the periodical variation of reflecting (transmitting) an optical signal performed by the ring resonator 21 to the regular cycle (wavelength) of the ITU grid.

So the ring resonator for wavelength fixing 21 does not need a heater for adjusting a phase and a wavelength is to be unvarying therein even if outside temperature varies. The ring resonator 22 for wavelength tunable operation requires a thermal phase shifter with low power consumption, that is, the film heater 22h. As described, the wavelength tunable laser 10 needs to comprise the ring resonators 21 and 22 which has different characteristics from each other.

In other words, it is preferable that the wavelength tunable laser 10 employs respectively the ring resonator for wavelength fixing 21 with low thermal resistance where refraction index does not easily vary in changing outside temperature and the ring resonator for wavelength tuning 22 with high thermal resistance to reduce power consumption. The adiabatic grooves 22b, 22c and 22d formed in the peripheral area of the ring waveguide for wavelength tuning 22a are efficient for having different thermal resistances on the same surface of the PLC substrate 13. Additionally, the bridge structure with the adiabatic groove 22e where the waveguide for wavelength tuning 22a is floated is also efficient.

End faces of the PLC substrate 13 are coated with the anti-reflection film 15 and the high reflection film 14, and the SOA 16 is connected to the anti-reflection film 15 side. The SOA may be connected to the PLC substrate 13 indirectly placing a lens therebetween, or may be implemented directly on the PLC substrate 13 with an implementing method such as passive alignment, other than the direct connection shown in the drawings. The multiple ring resonator 20 is configured in two-stage. The adiabatic grooves 22b, 22c and 22d are formed in the peripheral area of the ring waveguide for wavelength tuning 22a, and they collect heat generated by the film heater 22h efficiently. Because thermal resistance is increased by the adiabatic grooves 22b, 22c and 22d, power consumption of the thermal phase shifter can be reduced. An adiabatic groove is not formed in the peripheral area of the ring waveguide for wavelength fixing 21a, so thermal resistance is low and temperature of the silicon substrate 30 can be easily conducted to the ring waveguide for wavelength fixing 21a. In addition, even if ambient temperature outside of the package changes, temperature is not varied easily in the ring waveguide for fixing wavelength 21a with low thermal resistance, and stable operation can be expected.

The example shown in FIG. 2B is about the structure of the peripheral area of the ring waveguide for wavelength tuning 22a which is floated. It can increase a thermal resistance more than the example shown in FIG. 2A, so power consumption can be reduced further. Also, because an adiabatic structure is not installed in the peripheral area of the ring waveguide for wavelength fixing 21a as well as the example of FIG. 2A, a wavelength does not vary a lot according to ambient temperature and stable operation can be expected.

As described in the above, according to the present embodiment, stable operation is achieved, even in varying ambient temperature, with the wavelength tunable laser 10 combined the multiple ring resonator 20 and SOA 16 where the ring waveguide for wavelength fixing 21a does not have an adiabatic structure thereby so as to keep a low thermal resistance condition. On the other hand, the ring waveguide for wavelength tuning 22a with the film heater 22h attached thereto has the adiabatic grooves 22b, ... formed nearby so as to increase thermal resistance and to reduce power consumption. Thus, the ring resonators 21 and 22 formed in the PLC substrate 13 have different thermal resistances each other in accordance with those purposes so that low power consumption and stable operation can be achieved.

Second Embodiment

The first embodiment shown in FIG. 1 described a ring resonator for wavelength tuning which is used in one stage, however, the present invention is not limited in the case above and can be applied in the structure where ring resonators for wavelength tuning are installed in a plurality of stages. This will be explained in the followings as a second embodiment.

Figure 3:
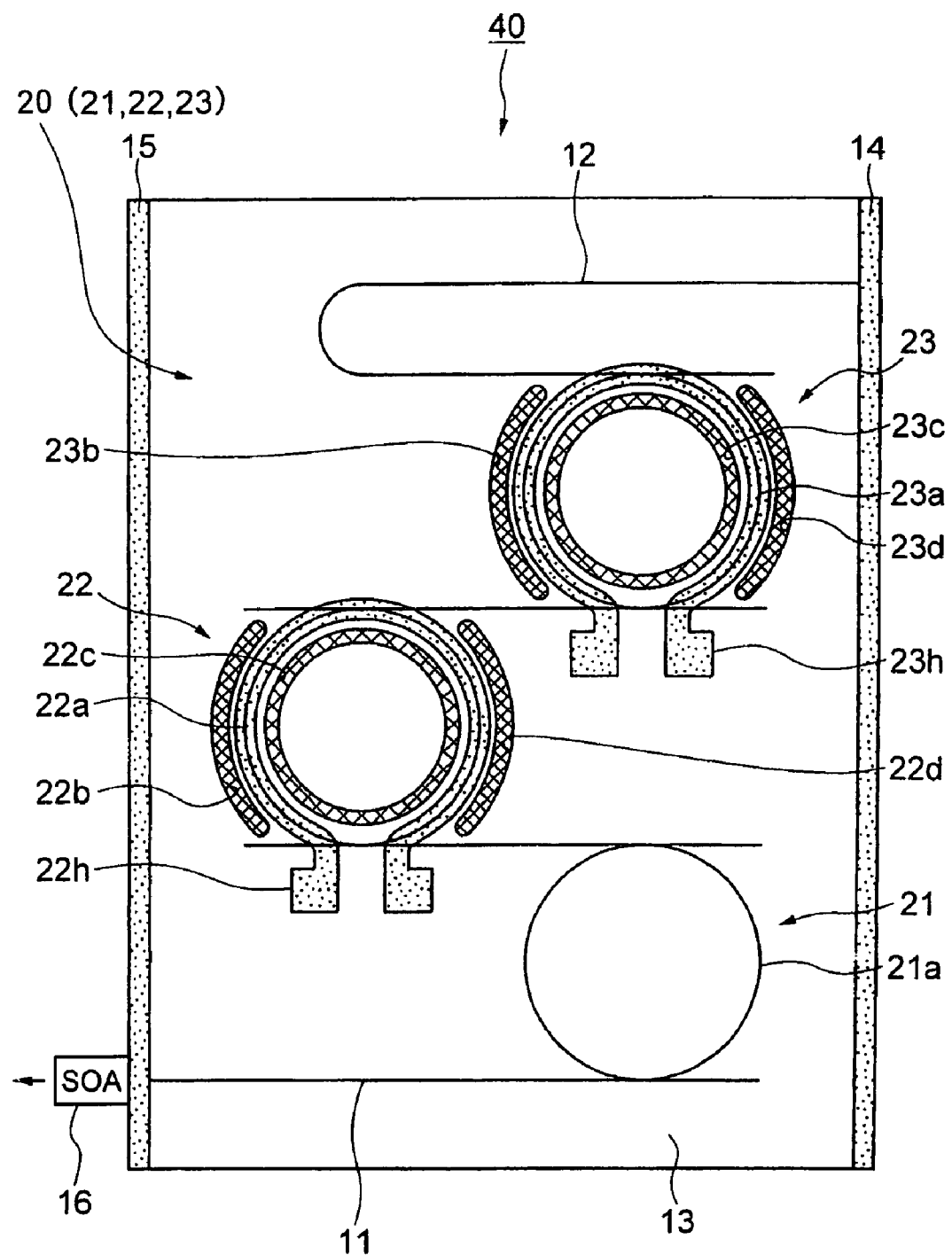
FIG. 3 is a plain view showing a wavelength tunable laser relating to a second embodiment of the present invention.

A wavelength tunable laser 40 according to the present embodiment comprises, as shown in FIG. 3, a multiple ring resonator 20, an input/output side waveguide 11, a reflection side waveguide 12, a high reflection film 14, a SOA (semiconductor optical amplifier) 16, a film heaters 22h and 23h, an adiabatic grooves 22b, 22c, 22d, 23b, 23c and 23d.

The multiple ring resonator 20 is configured by three ring resonators 21, 22 and 23 are combined. One ring resonator, the ring resonator 21, has a ring waveguide 21a and the other ring resonators, the ring resonators 22 and 23 have ring waveguides 22a and 23a. The ring waveguides 21a and 22a, 22a and 23a are coupled each other through directional couplers and waveguides (hereinafter both numerals are omitted). Here, the multiple ring resonators 20 relating to this embodiment of the present invention is configured by three ring resonators 21, 22 and 23 connected serially.

The input/output side waveguide 11 is coupled to a ring waveguide 21a of the ring resonator 21 through a directional coupler. Also, the reflection side waveguide 12 is coupled to a ring waveguide 23a of the ring resonator 23 through a directional coupler. The high reflection film 14 is set at the end of the reflection side waveguide 12 and has a function to reflect a light signal, which is outputted from the multiple ring resonator 20 to the reflection side waveguide 12, to the reflection side waveguide 12 side. The SOA 16 is connected to the input/output side waveguide 11 at its input/output terminal (a numeral is omitted) through an anti-reflection film 15.

The multiple ring resonator 20, the input/output side waveguide 11 and the reflection side waveguide 12 are created in the PLC substrate 13.

The film heaters 22h and 23h are formed on the PLC substrate 13 surrounding the ring waveguides 22a and 23a respectively and provide heat to the ring waveguides 22a and 23a. The adiabatic grooves 22b, 22d, 23b and 23d are formed on the PLC substrate 13 covering the film heaters 22h and 23h at the peripheral side, and the adiabatic grooves 22c and 23c are formed on the PLC substrate 13 covering the film heaters 22h and 23h at the inner peripheral side. Those adiabatic grooves 22b, 22c, 22d, 23b, 23c and 23d prevent heat provided by the film heaters 22h and 23h from influencing other component parts in the PLC substrate 13. Especially, these adiabatic grooves 22b, 22c, 22d, 23b, 23c and 23d prevent heat from the ring waveguide 21 of the ring resonator 21 so as not to vary an optical path length thereof, that is a circumferential length thereof, and a refraction index thereof.

The ring waveguide for wavelength fixing 21a and the ring waveguides for wavelength tuning 22a and 23a are set with different optical path lengths from each other. The film heaters 22h and 23h are made of aluminum film and the like in circular arch shape along with the ring waveguides for wavelength tuning 22a and 23a and both sides of the circular shape are conducting electrodes. Because optical path lengths of the ring waveguides 21a, 22a and 23a are set in different, the multiple ring resonator 20 in which the ring resonators 21, 22 and 23 are combined is configured to resonate at a wavelength where frequencies of the ring resonators 21, 22 and 23 with different cycles from each other are crossed. Also, a resonant wavelength of the multiple ring resonator 20 can be tuned according to variation of a circumferential lengths and refraction index of the ring waveguides 21a, 22a and 23a. Therefore, according to the present embodiment, the ring waveguides 21a, 22a and 23a are provided heat from the film heaters 22h and 23h to vary a circumferential lengths and refraction index of the ring waveguides 21a, 22a and 23a, which tunes a resonant wavelength of the multiple ring resonator 20. Other configurations are the same as the embodiment shown in FIG. 1.

The wavelength tunable laser 40 is configured to select resonation mode utilizing a characteristic of a drop port in the ring resonators 21-23, that is transmitting a wavelength, so as to oscillate in single axis mode. Circumferences of the ring resonators 21, 22 and 23 in three stages comprised by the multiple ring resonator 20 are set in slightly different lengths from each other. Accordingly, even if a tuning range of the resonant wavelength of the three ring resonators 21, 22 and 23 is as wide as several dozen nm, those three ring resonators 21, 22 and 23 resonate only at a wavelength where respective frequencies of the ring resonators 21, 22 and 23 are crossed and an oscillation in the single axis mode is generated at the wavelength. Wavelength tuning is mainly operated by conducting electricity to the film heater 22h and 23h formed in the ring resonators 22 and 23. For example, when circumferences (that is, optical path lengths) of the ring resonators 21-23 are respectively 4000 μm, 4400 μm, 4040 μm, the ring resonator 22 operates as a wavelength tuning means for fine adjustment and the film heater 23h operates as a wavelength tuning means for coarse adjustment. Also, wavelength control within as small as several dozen pm is operated to conduct electricity to a phase control area of the SOA 16. According to the wavelength tunable laser 40 of the present embodiment, the same function and effect as the first embodiment can be achieved.

INDUSTRIAL APPLICABILITY

As described in the above, a wavelength tunable laser combining a multiple resonator and a light input/output unit is effective as follows. A ring resonator for fixing a wavelength does not have an adiabatic structure installed therein so as to keep low thermal resistance, and stable operation thereof is achieved. Adiabatic grooves are formed in a peripheral area of a ring resonator for tuning a wavelength in which a heat supply unit is placed, which increases a thermal resistance and decreases power consumption. Thus, each ring resonator in a substrate has thermal resistance arranged respectively according to purposes of the ring resonators so that low power consumption and stable operation can be achieved.

What is claimed is:

1. A wavelength tunable laser comprising:
   a multiple ring resonator where a plurality of ring resonators is combined;
   an input/output unit for inputting/outputting an optical signal to/from the multiple ring resonator;
   a reflection unit for reflecting the optical signal outputted from the multiple ring resonator and returning the optical signal to the multiple ring resonator;
   a substrate in which the multiple ring resonator is formed;
   a heat supply unit arranged on the substrate for providing heat to the plurality of ring resonators and controlling a resonant wavelength of the plurality of ring resonators; and
   a thermal conduction restraining unit for limiting heat supply from the heat supply unit only to a particular ring resonator and shutting off heat supply to remaining ring resonators;
   wherein the multiple ring resonator comprises a plurality of ring resonators for wavelength tuning and a ring resonator for wavelength fixing,
   wherein the thermal conduction restraining unit is an adiabatic groove formed in the substrate, and
   wherein the adiabatic groove is positioned outside of one of the ring resonators for wavelength tuning, and is formed in a circular arch shape along with the ring resonator for wavelength tuning.

2. The wavelength tunable laser, as claimed in claim 1, wherein the adiabatic groove is formed from a surface of the substrate through an underneath of the ring resonator for wavelength tuning.

3. The wavelength tunable laser, as claimed in claim 1, wherein the input/output unit is a semiconductor optical amplifier.

4. The wavelength tunable laser, as claimed in claim 1, wherein the heat supply unit is a film heater.

5. The wavelength tunable laser, as claimed in claim 1, wherein the plurality of ring resonators for wavelength tuning and the ring resonator for wavelength fixing have different optical path lengths.

6. The wavelength tunable laser, as claimed in claim 1, wherein the adiabatic groove is a thermal isolation groove.

7. The wavelength tunable laser, as claimed in claim 2, wherein the adiabatic groove is a thermal isolation groove.

8. The wavelength tunable laser, as claimed in claim 1, wherein the plurality of ring resonators for wavelength tuning have a high thermal resistance, and the ring resonator for wavelength fixing has a low thermal resistance.

9. The wavelength tunable laser, as claimed in claim 1, wherein the heat supply unit is formed over substantially the entire length of the ring resonator for wavelength tuning.

* * * * *